United States Patent
Casavant et al.

(10) Patent No.: US 6,975,976 B1
(45) Date of Patent: Dec. 13, 2005

(54) PROPERTY SPECIFIC TESTBENCH GENERATION FRAMEWORK FOR CIRCUIT DESIGN VALIDATION BY GUIDED SIMULATION

(75) Inventors: Albert E. Casavant, Belle Mead, NJ (US); Aarti Gupta, Princeton, NJ (US); Pranav Ashar, Belle Mead, NJ (US)

(73) Assignee: NEC Corporation, Tokyo (JP)

( * ) Notice: Subject to any disclaimer, the term of this patent is extended or adjusted under 35 U.S.C. 154(b) by 780 days.

(21) Appl. No.: 09/693,976

(22) Filed: Oct. 23, 2000

Related U.S. Application Data

(60) Provisional application No. 60/190,100, filed on Mar. 20, 2000.

(51) Int. Cl.⁷ ............................................. G06F 17/50
(52) U.S. Cl. ........................... 703/14; 703/15; 703/16; 716/4
(58) Field of Search .............................. 703/14–16, 21; 716/4

(56) References Cited

U.S. PATENT DOCUMENTS

| | | | |
|---|---|---|---|
| 5,953,519 A * | 9/1999 | Fura .............................. | 716/18 |
| 6,182,258 B1 * | 1/2001 | Hollander .................... | 714/739 |
| 6,185,726 B1 * | 2/2001 | Chou ........................... | 716/18 |
| 6,233,540 B1 * | 5/2001 | Schaumont et al. .......... | 703/14 |
| 6,243,852 B1 * | 6/2001 | Yoshikawa .................... | 716/18 |
| 6,321,363 B1 * | 11/2001 | Huang et al. ................... | 716/4 |
| 6,477,683 B1 * | 11/2002 | Killian et al. ................... | 716/1 |

OTHER PUBLICATIONS

Gupta et al., "Toward formalizing a validation methodology using simulation coverage," Design Automation Conference, 1997. Proceedings of the 34th, Jun. 9-13, 1997 pp. 740-745.*

Fallah et al., "Simulation Vector Generation from HDL Descriptions for Observability-Enhanced Statement Coverage," Proc. 36 Design Automation Conf., 1999, pp. 158-167.*

Ganai et al., "Enhancing Simulation with BDDs and ATPG," Proc. Design Automation Conference, 1999, pp. 385-390.*

Geist et al., "Coverage-directed test generation using symbolic techniques," In Proceedings of the International Conference on Formal Methods in CAD, pp. 143-158, Nov. 1996.*

F. Balarin, et al., "An iterative approach to language containment," In Proceedings of the International Conference on Computer-Aided Verification, vol. 697 of Lecture Notes in Computer Science, pp. 29-40, 1993.

R. K. Brayton et al., "VIS: A system for verification and synthesis", In R. Alur and T. Henzinger, editors, Proceedings of the International Conference on Computer-Aided Verification, vol. 1102, pp. 428-432. Springer-Verlag, Jun. 1996.

(Continued)

*Primary Examiner*—John Follansbee
*Assistant Examiner*—Aaron C Perez-Daple
(74) *Attorney, Agent, or Firm*—Sughrue Mion, PLLC

(57) ABSTRACT

Simulation continues to be the primary technique for functional validation of designs. It is important that simulation vectors be effective in targeting the types of bugs designers expect to find rather than some generic coverage metrics. The focus of this work is to generate property-specific testbenches that are targeted either at proving the correctness of a property or at finding a bug. It is based on performing property-specific analysis on iteratively less abstract models of the design in order to obtain interesting paths in the form of a Witness Graph, which is then targeted during simulation of the entire design. This testbench generation framework will form an integral part of a comprehensive verification system currently being developed.

43 Claims, 21 Drawing Sheets

OTHER PUBLICATIONS

Figure 1:
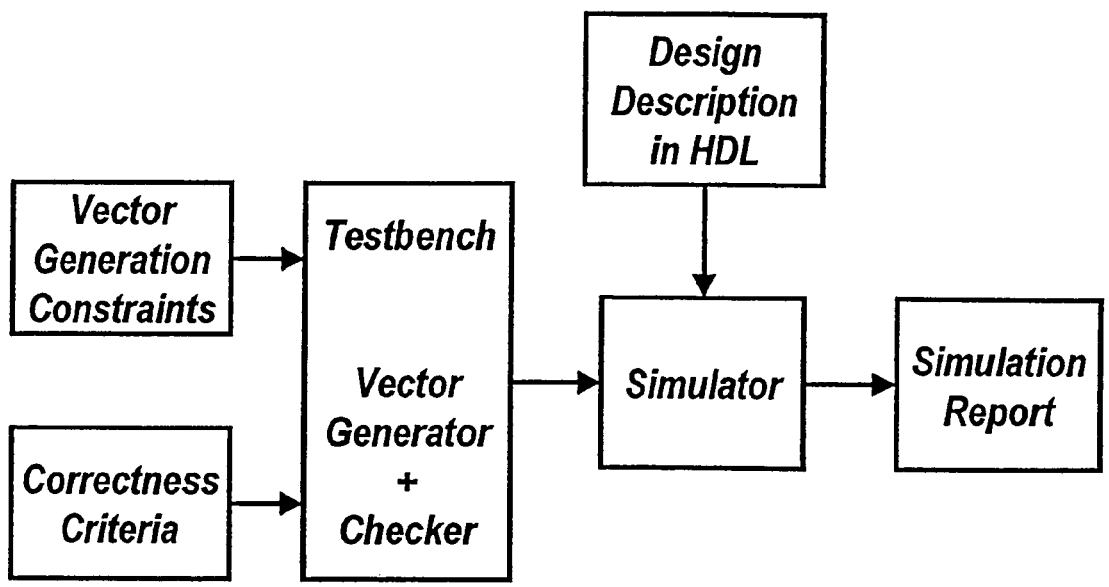

R. E. Bryant, "Graph-based algorithms for Boolean function manipulation", IEEE Transactions on Computers, C-35(8): 677--691, Aug. 1986.

J. R. Burch, E. M. Clarke, D. E. Long, K. L. McMillan, and D. L. Dill, "Symbolic model checking for sequential circuit verification", IEEE Transactions on Computer-Aided Design, 13(4):401-424, Apr. 1994.

A. K. Chandra, et al., "Avpgen—a test case generator for architecture verification", IEEE Transaction on VLSI Systems, 6(6), Jun. 1995.

E. M. Clarke, et al., "Automatic verification of finite-state concurrent systems using temporal logic specifications", ACM Transactions on Programming Languages and Systems, 8(2):244-263, Apr. 1986.

E. M. Clarke, et al., "Counterexample-guided abstraction refinement", In Proceedings of the International Conference on Computer-Aided Verification, vol. 1855 of Lecture Notes in Computer Science, pp. 154-169, 2000.

F. Fallah, et al., "Functional vector generation for HDL models using linear programming and 3-Satisfiability", In Proceedings of the Design Automation Conference, pp. 528-533, San Francisco, CA, Jun. 1998.

M. Ganai, et al., "Augmenting simulation with symbolic algorithms", In Proceedings of the Design Automation Conference, Jun. 1999.

D. Geist, et al., "Coverage-directed test generation using symbolic techniques", In Proceedings of the International Conference on Formal Methods in CAD, pp. 143-158, Nov. 1996.

R. C. Ho, et al., "Architecture validation for processors", In Proceedings of the 22nd Annual International Symposium on Computer Architecture, Jun. 1995.

Y. Hoskote, et al., "Coverage estimation for symbolic model checking", In Proceedings of the Design Automation Conference, pp. 300-305, Jun. 1999.

Y. Hoskote, et al., "Automatic extraction of the control flow machine and application to evaluating coverage of verification vector", In Proceedings of the International Conference on Computer Design, pp. 532-537, Oct. 1995.

C.-Y. Huang, et al., "Assertion checking by combined word-level ATPG and modular arithmetic constraint-solving techniques", In Proceedings of the Design Automation Conference, pp. 118-123, 2000.

C. N. Ip, et al. "Using symbolic analysis to optimize explicit reachability analysis", In Proceedings of Workshop on High Level Design Validation and Test, 1999.

S. Katz, et al., "Have I Written Enough Properties? —a method of comparison between specification and implementation", In Proceedings of Correct Hardware Design and Verification Methods (CHARME), vol. 1703 of Lecture Notes In Computer Science, pp. 280-297, Sep. 1999.

A. Kuehlmann, et al., "Probabilistic state space search", In Proceedings of the International Conference on Computer-Aided Design, 1999.

W. Lee, et al., "Tearing based abstraction for CTL model checking", In Proceedings of the International Conference on Computer-Aided Design. pp. 76-81, San Jose, CA, Nov. 1996.*

J. Lind-Nielsen, et al., "Stepwise CTL model checking of state/event systems", In Proceedings of the International Conference on Computer-Aided Verification, vol. 1633 of Lecture Notes in Computer Science, pp. 316-327. Springer-Verlag, 1999.*

D. E. Long, Model Checking, Abstraction and Modular Verification, PhD thesis, School of Computer Science, Carnegie Mellon University, Pittsburgh, PA, Jul. 1993.*

A. Pardo, et al., "Automatic abstraction techniques for propositional $\mu$-calculus model checking", In Proceedings of the International Conference on Computer Aided Verification, vol. 1254 of Lecture Notes in Computer Science, pp. 12--23, Jun. 1997*

R. Sumners, et al., "Improving witness search using orders on states", In Proceedings of the International Conference on Computer Design, pp. 452--457, 1999.*

Synopsys, Inc. VERA System Verifier, http://www.synopsys.com/products/vera/vera.html.*

TransEDA, Inc. Verification Navigator, http://www.transeda.com.*

Verisity Design, Inc. Specman Elite, http://www.verisity.com/html/specmanelite.html.*

K. Wakabayashi, "C-based Synthesis Experiences with a Behavior Synthesizer "Cyber"", In Proceedings of the Design Automation and Test in Europe (DATE) Conference, pp. 390-393, 1999.*

C. Han Yang, et al., David L. Dill, "Validation with guided search of the state space", In Proceedings of the Design Automation Conference, Jun. 1998.*

J. Yuan, et al., "On combining formal and informal verification", In Proceedings of the International Conference on Computer-Aided Verification, vol. 1254 of Lecture Notes in Computer Science, pp. 376-387, Jun. 1997.*

* cited by examiner

```
mc_for_sim(model m, ctlFormula f) {
 ctlFormula f1, f2, negf;
 states upper,upper1,upper2=NULL,negative=NULL;
 // handle subformulas recursively if (f1 = leftChild(f)) {
   mc_for_sim(m,f1);
   upper1 = get_upper(f1);
 } if (f2 = rightChild(f)) {
   mc_for_sim(m,f2));
   upper2 = get_upper(f2);
 }

// case analysis on operator at this level
 switch(type(f)) {
       case TRUE: upper = ALL; break;
       case FALSE: upper = NULL; break;
       case ATOMIC: upper = mc_atomic(m,f); break;
       case NOT: upper = complement(upper1); break;
       case AND: upper = and(upper1,upper2); break;
       case OR: upper = or(upper1,upper2); break;
       case EX: case EF: case EU: case EG:
          upper = mc_etype(upper1,upper2); break;
       default: // A-type operators left
          switch(type(f)) {
          case AX: upper = mc_ex(upper1); break;
          case AF: upper = mc_ef(upper1); break;
          case AU: upper = mc_eu(upper1,upper2); break;
          case AG: upper = mc_eg(upper1); break;
          }
    // compute negative sets also
    negf = negate(f);
    mc_for_sim(m,negf);
    negative = and(upper,get_upper(negf)); break;
 }

// associate the sets with f
 associate(f, upper, negative);
}
```

Figure 8

```
check_mc (model m, ctlFormula f)
{
  mc_for_sim(m, f);
  if (initState(m) ∉ get_upper(f))
    result = PROPERTY_FALSE;
  else if (A-type(f) &&
    initState(m) ∉ get_negative(f))
    result = PROPERTY_TRUE;
  else
    result = INCONCLUSIVE;
  return result;
}
```

Figure 9

```
mark_witness_top(model m, ctlFormula f)
{
   reachable = compute_reachable(m,initState(m));

switch(type(f)){
        case AX: case AF: case AU: case AG:
           witness_top= and(get_negative(f),reachable);
           break;
        default:
           witness_top= and(get_upper(f),reachable);
   } mark_states(witness_top);
   mark_witness_rec(m, f, witness_top);
}
```

Figure 10a

```
mark_witness_rec(model m, ctlFormula f, states careSet)
{
 states witness, negWitness, subWitness;
 //   associate witness set for f
 witness = and(get_upper(f),careSet);
 associate_witness(f,witness);
 //   recursive calls with modified careSets
 switch(type(f)) { case TRUE:case FALSE:case ATOMIC:case NOT:
         break;

case AND: case OR:
       case EF: case EU: case EG:
         mark_witness_rec(m,leftChild(f),witness);
         if (rightChild(f) != NULL)
            mark_witness_rec(m,rightChild(f),witness);
         break;

case EX:
         subWitness = compute_image(m, witness);
         // mark additional states
         mark_states(subWitness);
         mark_witness_rec(m,leftChild(f),subWitness);
         break;

case AX: case AF: case AU: case AG:
         negWitness = and(get_negative(f),careSet);
         associate_neg_witness(f,negWitness);
         mark_witness_rec(m,negate(f),negWitness);
         break;
 }
}
```

Figure 10b

```
witness_sim(design d, ctlFormula f, state s)
{
    states w, w1;
    int result, neg_result;
    w = get_witness(f);
    w1 = get_witness(leftChild(f));
    //   case analysis on operator at this level switch(type(f)) { case TRUE: result = SUCCESS; break;

case FALSE: result = FAILURE; break;

case ATOMIC: result = satisfies(s,f); break;

case NOT: result=satisfies(s,negate(f));break;

case AND:
            result = witness_sim(d,leftChild(f),s);
            if (result==SUCCESS)
                result = witness_sim(d,rightChild(f),s);
            break;

case OR:
            result = witness_sim(d,leftChild(f),s);
            if (result==FAILURE)
                result = witness_sim(d,rightChild(f),s);
            break;

case EX:
            foreach state t, abs(t)∈w1, {
                if (exists_transition(s,t)){
                    result = witness_sim(d,leftChild(f),t);
                    if (result==SUCCESS) break;
                }
            }
            break;
```

Figure 15a

```
case EF:
    foreach state t, abs(t)∈w1, {
        if (path = find_a_path(s,t)){
            result = witness_sim(d,leftChild(f),t);
            if (result==SUCCESS) break;
        }
    }
    break;

case EU:
    result = witness_sim(d,rightChild(f),s);
    if (result==FAILURE){
        mark(s,f);
        result = witness_sim(d,leftChild(f),s);
        if (result==SUCCESS)
            foreach unmarked state t, abs(t)∈w {
                if (exists_transition(s,t)){
                    result = witness_sim(d,f,t);
                    if (result==SUCCESS) break;
                }
            }
    }
    break;

case EG:
    result = witness_sim(d,leftChild(f),s);
    if (result==SUCCESS){
        mark(s,f);
        if (exists_transition_to_marked(s,f))
            result = SUCCESS;
        else
            foreach unmarked state t,abs(t)∈w {
                if (exists_transition(s,t)){
                    result = witness_sim(d,f,t);
                    if (result==SUCCESS) break;
                }
            }
    }
    break;
```

Figure 15b

```
        case AX: case AF: case AU: case AG:
            if (abs(s) ∉ get_neg_witness(f))
                result = SUCCESS;
            else {
                // generate counter-example for !f
                neg_result = witness_sim(d,negate(f),s);
                result = (neg_result == SUCCESS) ?
                    FAILURE : SUCCESS;
            }

} // end switch
    return result;
```

Figure 15c

```
Testbench(){
...
  do {
    determine current state of design;
    determine abstract state from current state;
    query database for desirable transition;
    if (input vector NOT in database) {
L1: input vector = random vector;
       if (input vector satisfies condition) {
          simulate input vector;
          if (next abstract state != desired) {
            roll back simulation one cycle;
            go to L1;
          }
       }
    }
  } while (property is not yet proved/disproved);
...
}
```

Figure 18

PROPERTY SPECIFIC TESTBENCH GENERATION FRAMEWORK FOR CIRCUIT DESIGN VALIDATION BY GUIDED SIMULATION

CROSS-REFERENCE TO RELATED APPLICATION

This application claims the benefit of U.S. Provisional Application No. 60/190,100, filed Mar. 20, 2000.

BACKGROUND OF THE INVENTION

1. Field of the Invention

This invention relates to the design of large and complex hardware or hardware-software combinations. More particularly, this invention discloses witness graphs, and their use in design validation in the automatic generation of test benches and in a coverage metric.

2. Background and Related Art

The following papers provide useful background information, for which they are incorporated herein by reference in their entirety, and are selectively referred to in the remainder of this disclosure by their accompanying reference numbers in angle brackets (i.e., <1> for the first numbered paper by Balarin and Sangiovanni-Vincentelli):

1. F. Balarin and A. Sangiovanni-Vincentelli, "An iterative approach to language containment," In Proceedings of the International Conference on Computer-Aided Verification, volume 697 of Lecture Notes in Computer Science, pages 29–40, 1993.
2. R. K. Brayton et al. "VIS: A system for verification and synthesis", In R. Alur and T. Henzinger, editors, Proceedings of the Internation Conference on Computer-Aided Verification, volume 1102, pages 428–432. Springer-Verlag, June 1996.
3. R. E. Bryant, "Graph-based algorithms for Boolean function manipulation", IEEE Transactions on Computers, C-35(8): 677–691, August 1986.
4. J. R. Burch, E. M. Clarke, D. E. Long, K. L. McMillan, and D. L. Dill, "Symbolic model checking for sequential circuit verification", IEEE Transactions on Computer-Aided Design, 13(4): 401–424, April 1994.
5. A. K. Chandra, V. S. Iyengar, D. Jameson, R. Jawalekar, I. Nair, B. Rosen, M. Mullen, J. Yoor, R. Armoni, D. Geist, and Y. Wolfsthal, "Avpgen—a test case generator for architecture verification", IEEE Transactions on VLSI Systems, 6(6), June 1995.
6. E. M. Clarke, E. A. Emerson, and A. P. Sistla, "Automatic verification of finite-state concurrent systems using temporal logic specifications", ACM Transactions on Programming Languages and Systems, 8(2): 244–263, April 1986.
7. E. M. Clarke, O. Grumberg, Y. Lu, and H. Veith, "Counterexample-guided abstraction refinement", In Proceedings of the International Conference on Computer-Aided Verification, volume 1855 of Lecture Notes in Computer Science, pages 154–169, 2000.
8. F. Fallah, S. Devadas, and K. Keutzer, "Functional vector generation for HDL models using linear programming and 3-Satisfiability", In Proceedings of the Design Automation Conference, pages 528—533, San Francisco, Calif., June 1998.
9. M. Ganai, A. Aziz, and A. Kuehlmann, "Augmenting simulation with symbolic algorithms", In Proceedings of the Design Automation Conference, June 1999.
10. D. Geist, M. Farkas, A. Landver, Y. Lichtenstein, S. Ur, and Y. Wolfsthal, "Coverage-directed test generation using symbolic techniques", In Proceedings of the International Conference on Formal Methods in CAD, pages 143–158, November 1996.
11. R. C. Ho, C. H. Yang, M. A. Horowitz, and D. L. Dill, "Architecture validation for processors", In Proceedings of the 22nd Annual International Symposium on Computer Architecture, June 1995.
12. Y. Hoskote, T. Kam, P.-H. Ho, and X. Zhao, "Coverage estimation for symbolic model checking", In Proceedings of the Design Automation Conference, pages 300–305, June 1999.
13. Y. Hoskote, D. Moundanos, and J. A. Abraham, "Automatic extraction of the control flow machine and application to evaluating coverage of verification vectors", In Proceedings of the International Conference on Computer Design, pages 532–537, October 1995.
14. C.-Y. Huang and K.-T. Cheng, "Assertion checking by combined word-level ATPG and modular arithmetic constraint-solving techniques", In Proceedings of the Design Automation Conference, pages 118–123, 2000.
15. C. N. Ip, "Using symbolic analysis to optimize explicit reachability analysis", In Proceedings of Workshop on High Level Design Validation and Test, 1999.
16. S. Katz, O. Grumberg, and D. Geist, "Have I Written Enough Properties?—a method of comparison between specification and implementation", In Proceedings of Correct Hardware Design and Verification Methods (CHARME), volume 1703 of Lecture Notes in Computer Science, pages 280–297, September 1999.
17. A. Kuehlmann, K. McMillan, and R. K. Brayton, "Probabilistic state space search", In Proceedings of the International Conference on Computer-Aided Design, 1999.
18. R. P. Kurshan, Computer-Aided Verification of Coordinating Processes: The Automata-Theoretic Approach, Princeton University Press, 1995.
19. W. Lee, A. Pardo, J. Jang, G. Hachtel, and F. Somenzi, "Tearing based abstraction for CTL model checking", In Proceedings of the International Conference on Computer-Aided Design, pages 76–81, San Jose, Calif., November 1996.
20. J. Lind-Nielsen and H. R. Anderson, "Stepwise CTL model checking of state/event systems", In Proceedings of the International Conference on Computer-Aided Verification, volume 1633 of Lecture Notes in Computer Science, pages 316–327. Springer-Verlag, 1999.
21. D. E. Long, Model Checking, Abstraction and Modular Verification, PhD thesis, School of Computer Science, Carnegie Mellon University, Pittsburgh, Pa., July 1993.
22. K. L. McMillan, Symbolic Model Checking, Kluwer Academic Publishers, 1993.
23. A. Pardo and G. Hachtel, "Automatic abstraction techniques for propositional $\mu$-calculus model checking", In Proceedings of the International Conference on Computer Aided Verification, volume 1254 of Lecture Notes in Computer Science, pages 12–23, June 1997.
24. R. Sumners, J. Bhadra, and J. Abraham, "Improving witness search using orders on states", In Proceedings of the International Conference on Computer Design, pages 452–457, 1999.
25. Synopsys, Inc. VERA System Verifier, http://www.synopsys.com/products/vera/vera.html.
26. TransEDA, Inc. Verification Navigator, http://www.transeda.com.

27. Verisity Design, Inc. Specman Elite, http://www.verisity.com/html/specmanelite.html.
28. K. Wakabayashi, "C-based Synthesis Experiences with a Behavior Synthesizer "Cyber" ", In Proceedings of the Design Automation and Test in Europe (DATE) Conference, pages 390–393, 1999.
29. C. Han Yang and David L. Dill, "Validation with guided search of the state space", In Proceedings of the Design Automation Conference, June 1998.
30. J. Yuan, J. Shen, J. Abraham, and A. Aziz, "On combining formal and informal verification", In Proceedings of the International Conference on Computer-Aided Verification, volume 1254 of Lecture Notes in Computer Science, pages 376–387, June 1997.

The Problem with Verification Techniques

Functional validation is one of the key problems hindering successful design of large and complex hardware or hardware-software combinations. The technology for formal verification, in which the correctness criteria (properties) are specified formally, and a tool exhaustively and automatically exercises the functionality of the design to prove the properties, has improved significantly in the recent past. In particular, the use of Computation Tree Logic (CTL)<6> as a way of specifying properties and model checking <4, 6, 22> as a method of proving the properties has shown the potential to become accepted in industry. Unfortunately, formal verification technology, including CTL-based model checking, is not robust enough yet to be relied upon as the sole validation technology. The primary hurdle is the inability of model checking tools to handle larger state spaces in current designs using reasonable quantities of resources. It is not clear that this gap will ever be closed in the future, and designers have to resort to simulation. On the other hand, simulation is inherently slow, requiring the simulation of billions of vectors for complex hardware. Furthermore, the coverage of design functionality provided by these vectors remains largely unknown.

Alternative to Formal Verification Techniques

A practical alternative is semi-formal verification, where the specification of correctness criteria is done formally, as in model checking, but checking is done using simulation, which is guided by directed vector sequences derived from knowledge of the design and/or the property being checked. Such a validation framework, shown in FIG. 1, consisting of a language for specifying correctness criteria and vector generation constraints is available from some EDA vendors, e.g. Specman Elite <27> from Verisity, Inc. and Vera <25> from Synopsys, Inc. This also has the potential of serving as an introduction to formal verification techniques for designers more familiar with simulation, thereby bridging the gap between the two.

Missing from the framework in FIG. 1 is the ability to develop the vector generation constraints automatically. Without this ability, the framework is too close to conventional simulation to be significantly more effective. A typical problem in finding bugs is characterizing corner cases which excite the bug. Random simulation is unlikely to detect corner cases because of the low probability of generating the specific vector sequences which lead to the bugs. Targeted simulation, where vector generation constraints are supplied manually by the designer, also does not always work because corner cases can be hard to capture. Thus, though the framework in FIG. 1 makes vector generation more efficient, in that it is able to push through more simulation vectors, it is unlikely to result in increased reliability.

SUMMARY OF THE INVENTION

Figure 2:
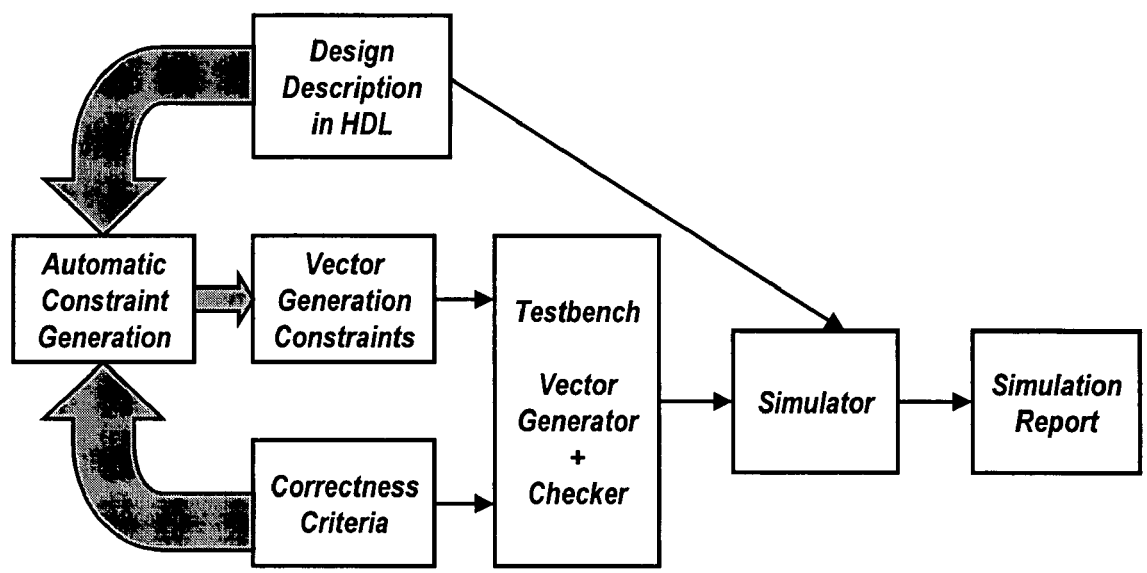

The focus of this work, as shown in FIG. 2, is to provide a way to automatically generate a smart testbench including automatically determining appropriate vector generation constraints, based on knowledge of both the design and property being checked, and also to provide a useful coverage metric for generated vectors.

BRIEF DESCRIPTION OF THE DRAWING FIGURES

Figure 3:
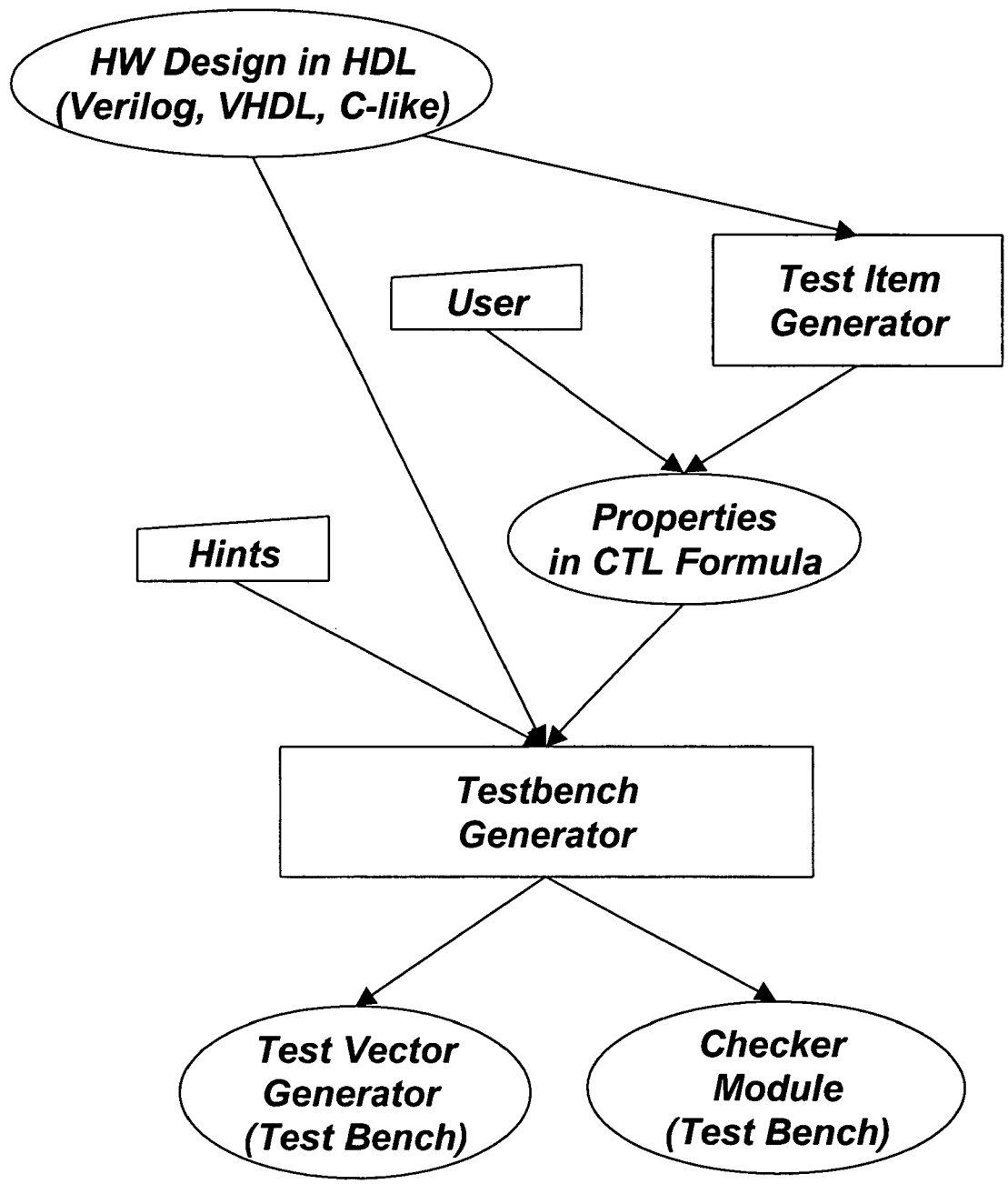
Figure 4:
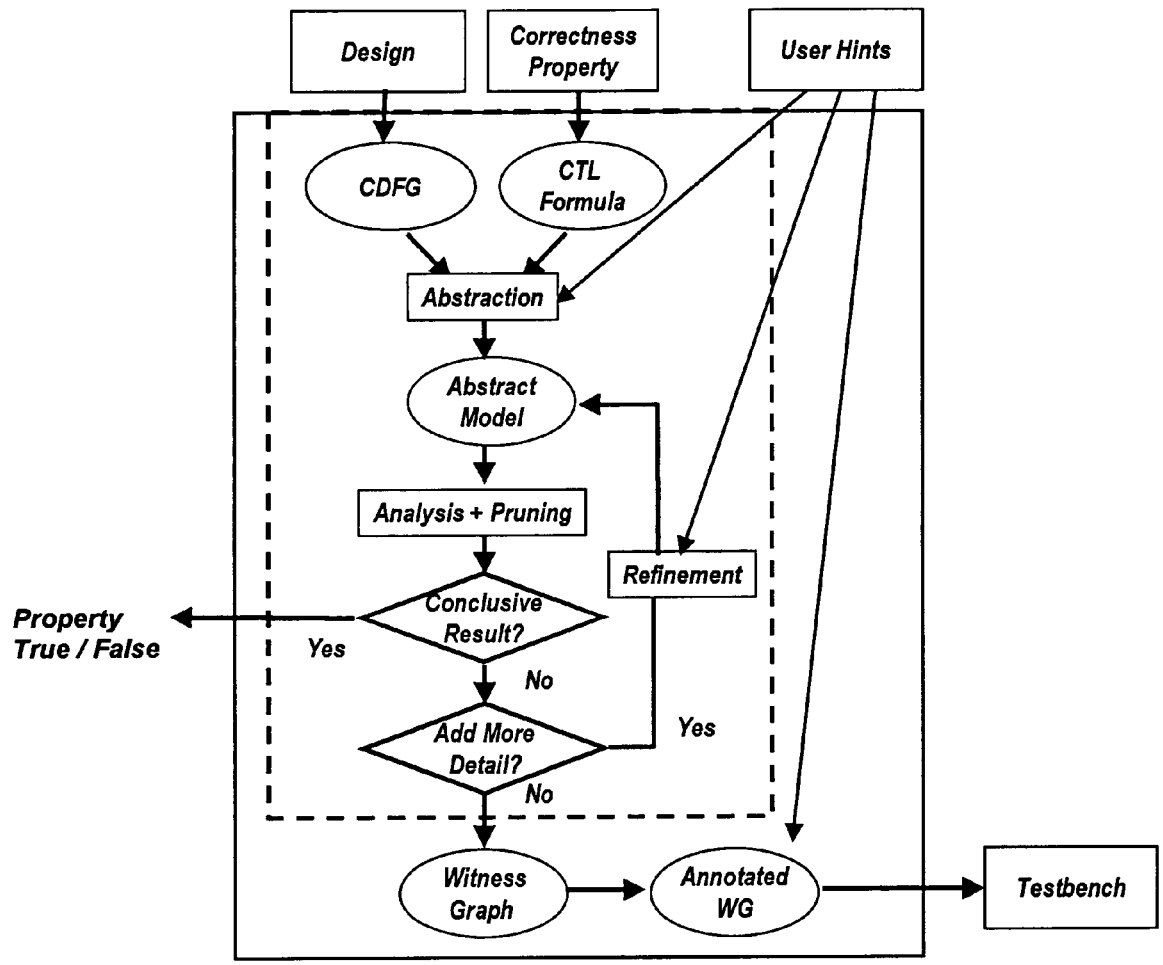
Figure 5:
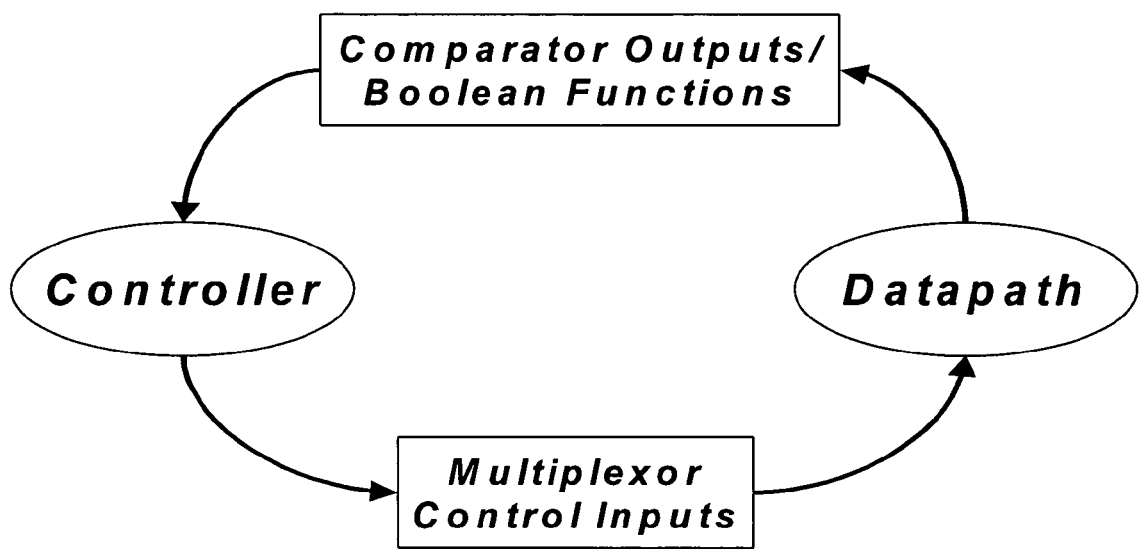
Figure 6:
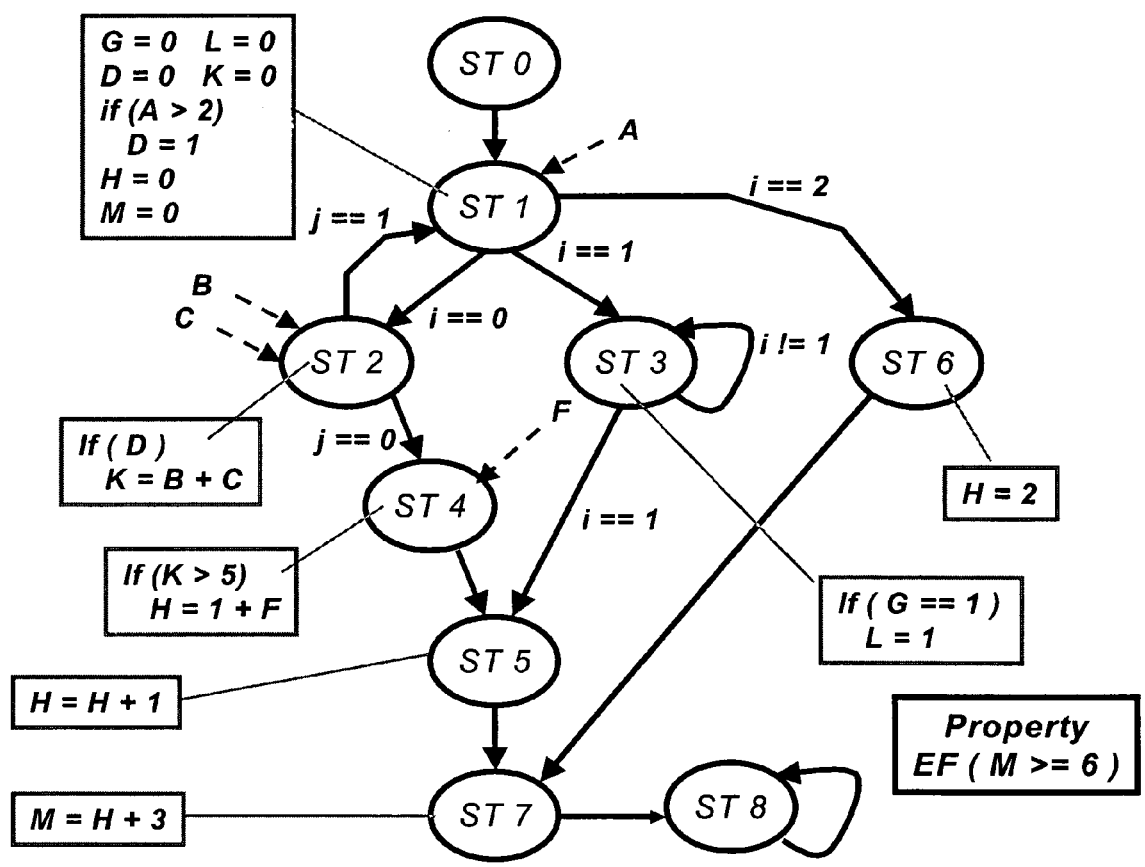
Figure 7:
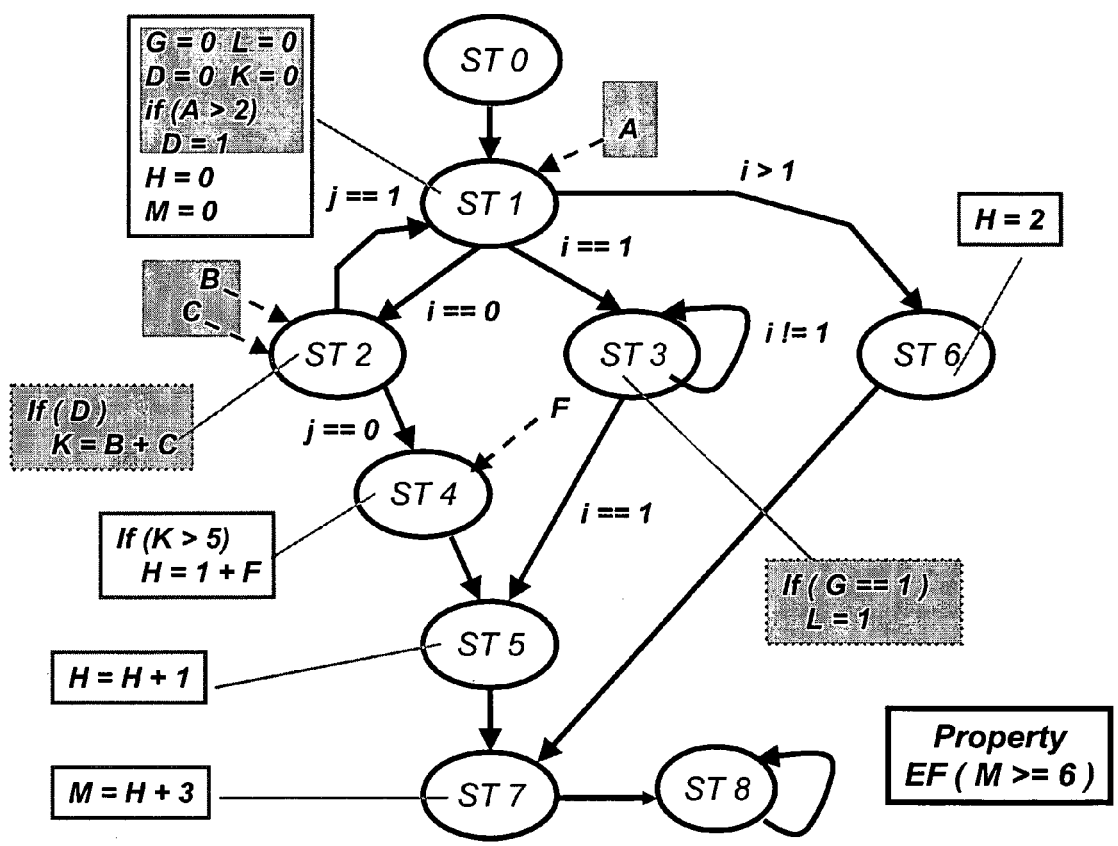
Figure 11:
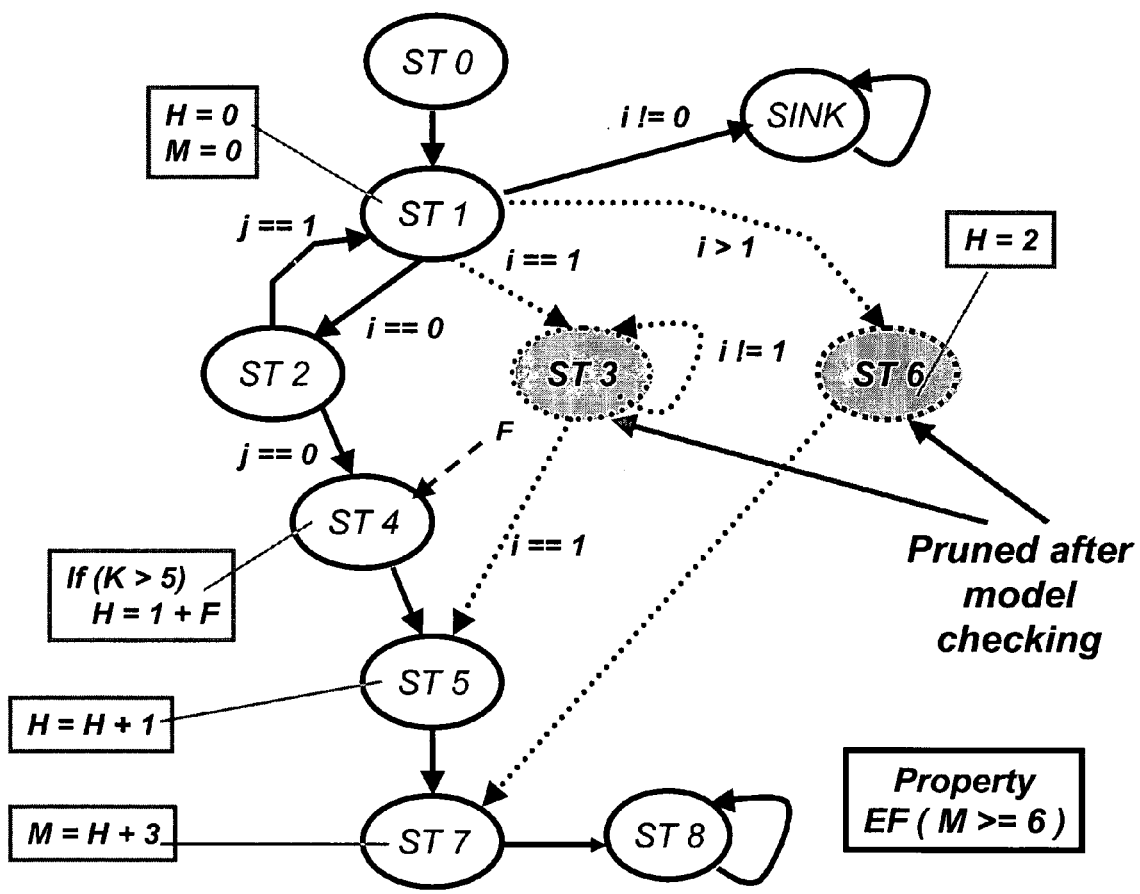
Figure 12:
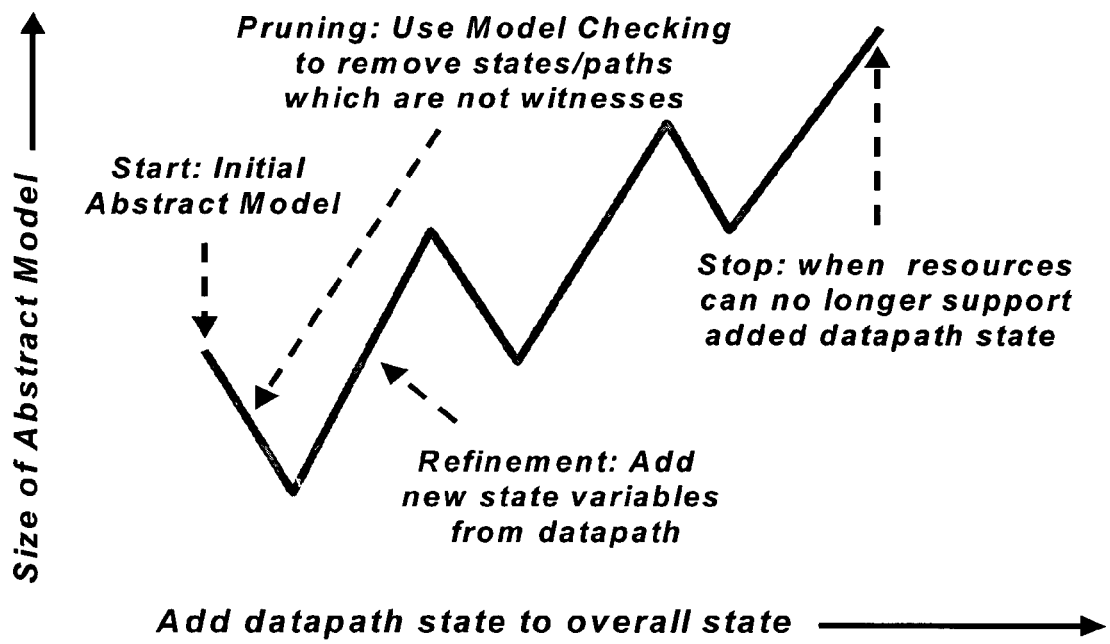
Figure 13:
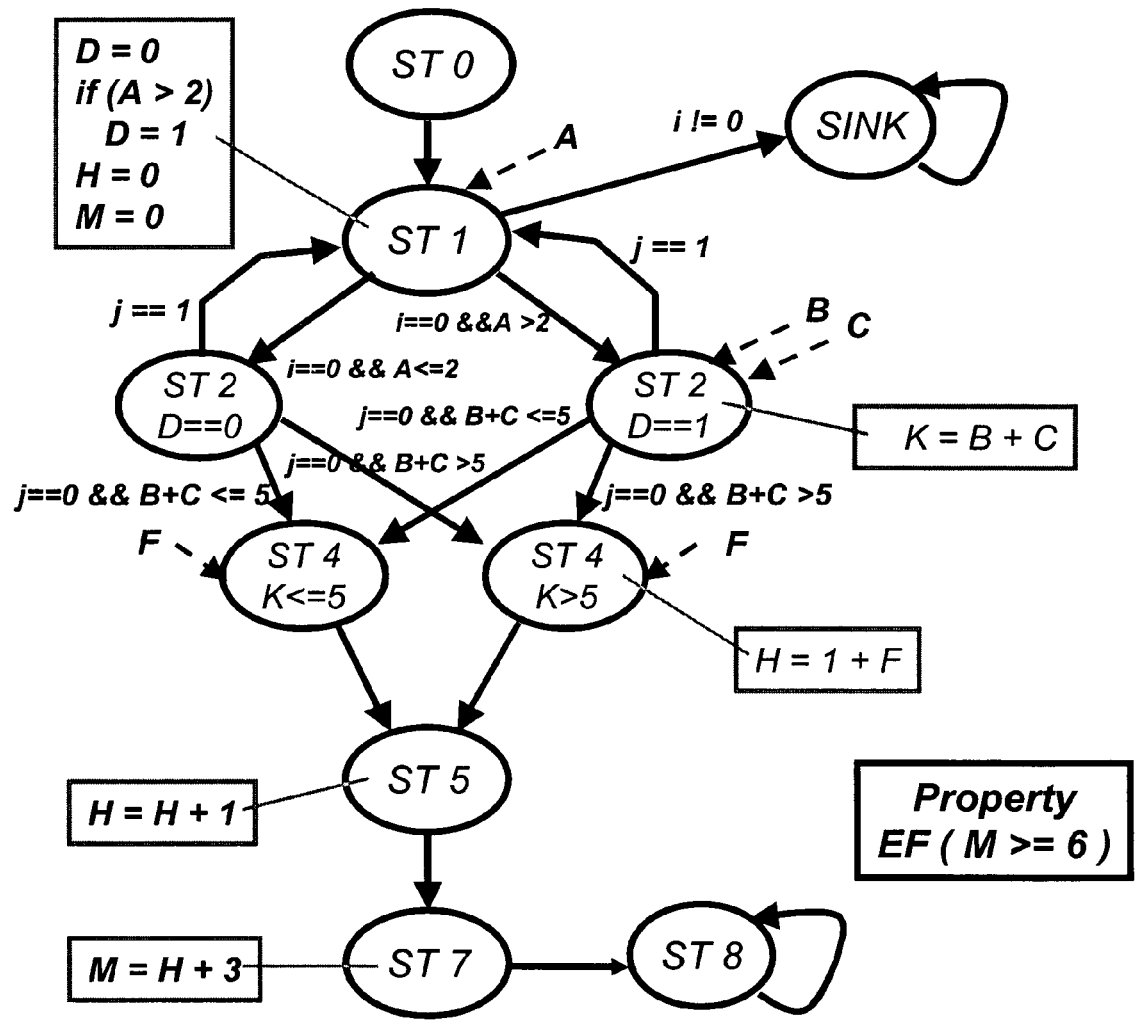
Figure 14:
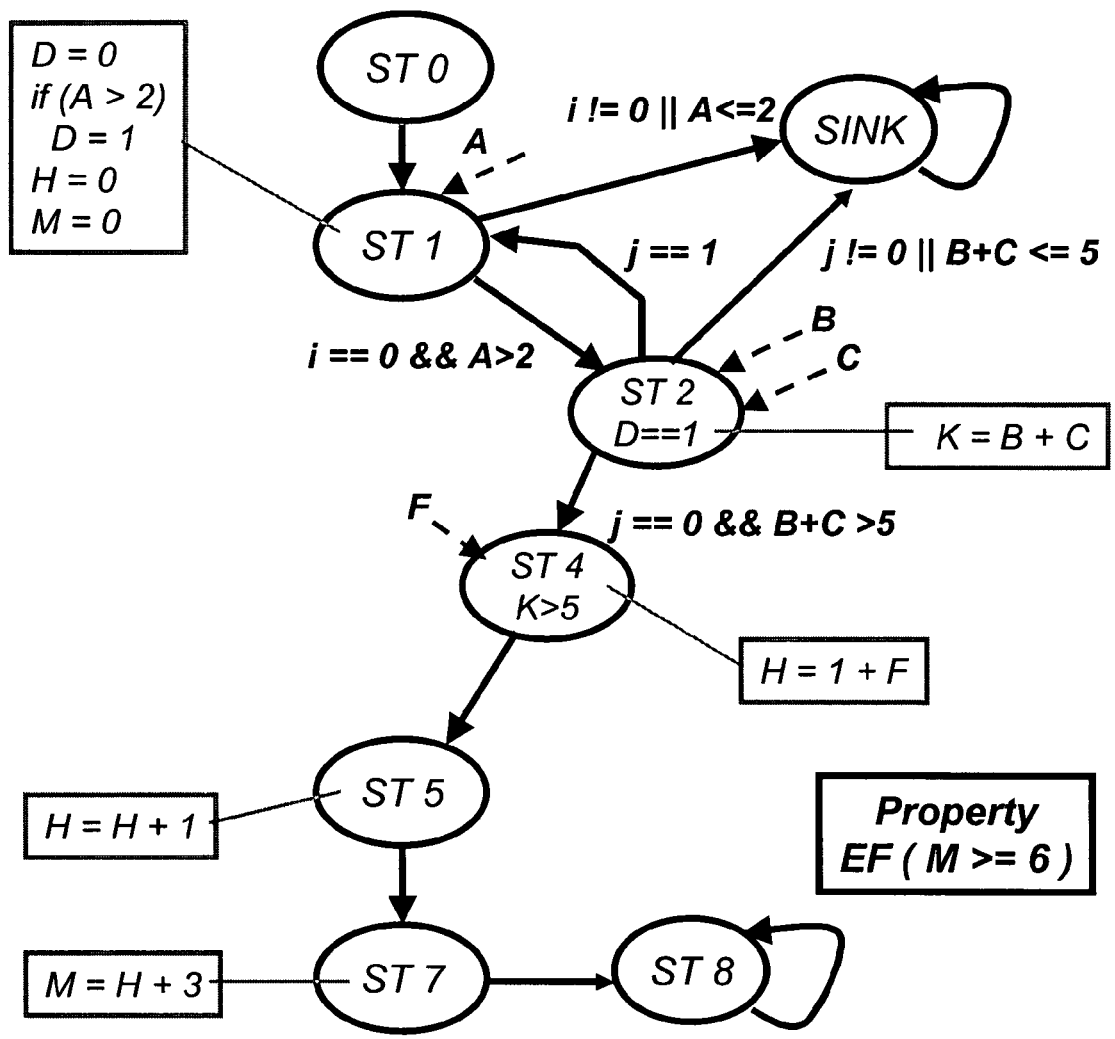
Figure 16:
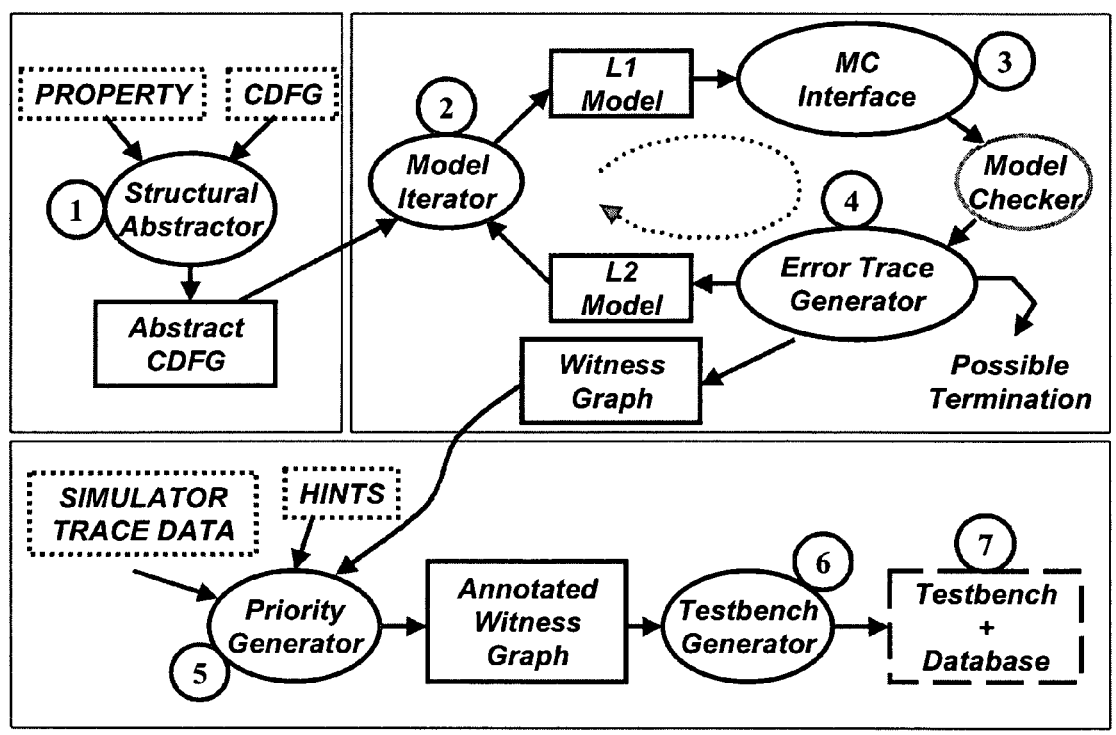
Figure 17:
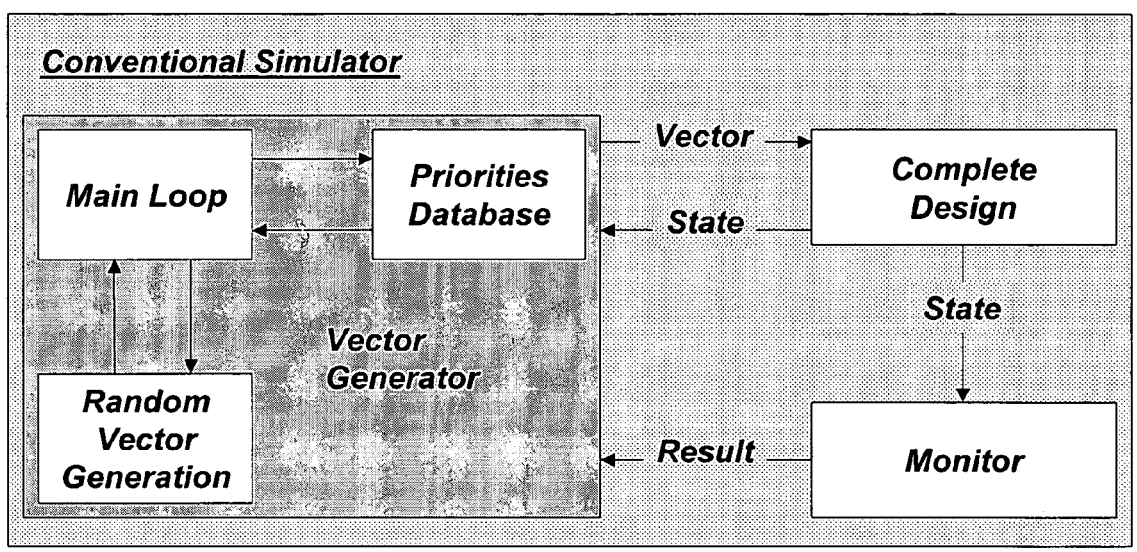

FIG. 1 shows a schematic diagram of property specification and guided simulation.
FIG. 2 shows a schematic diagram of a guided simulation with automatic constraint generation.
FIG. 3 shows a smart testbench generation setup.
FIG. 4 shows a witness graph generation process.
FIG. 5 shows a CDFG model for a design.
FIG. 6 shows an example CDFG and property.
FIG. 7 shows an initial abstract model.
FIG. 8 shows pseudocode for a symbolic model checking-based algorithm for CTL properties (mc_for_sim).
FIG. 9 shows pseudocode for checking a conclusive result.
FIGS. 10a and 10b shows pseudocode used for state marking (mark_witness_top and mark_witness_rec).
FIG. 11 shows a model after pruning.
FIG. 12 shows the iterative pruning and refinement process.
FIG. 13 shows a model after refinement.
FIG. 14 shows a final witness graph FIGS. 15a, 15b, and 15c, together, show pseudocode for an algorithm (called witness_sim) for generating a concrete witness during simulation.
FIG. 16 shows an example of a smart Testbench generator.
FIG. 17 shows a detailed simulation setup.
FIG. 18 shows simplified pseudocode for a testbench.

DETAILED DESCRIPTION OF THE PREFERRED EMBODIMENTS

Smart Testbench Generation Framework.
Consider the testbench generation framework shown in FIG. 3. In this discussion, the focus is on the use of CTL for formal specification of correctness properties, and these ideas can be applied similarly to other forms of specifications such as LTL, ω-regular automata etc. Furthermore, the properties for which targeted vector generation is performed could either be provided manually by the user, or be derived automatically from the hardware definition language (HDL) based on generic notions of correctness, e.g. through use of assertions.

The testbench consists of: (1) a test vector generator, and (2) a checker module (monitor) which checks for violation or satisfaction of the property (whether violation or satisfaction is checked depends on the nature of the property). In this framework, the testbench including the vector generator and checker is in C. It could equivalently be generated in a testbench language like E <27> or VERA <25>, or a hardware description language such as VHDL or Verilog depending on the simulator being used. The hardware description is also assumed to be in a C-like language. This allows for the exploitation of high-level information, which is useful for performing automatic analysis, as described in detail later. In addition to the design and the property, the setup is also configured to accept hints from the user and results from previous formal verification or simulation runs. At the end of a simulation run, if a property has not been checked to the desired level of satisfaction, the vector generator can be modified using feedback from the simulator.

The vector generator attempts to increase the likelihood that either a witness to the property or a counter-example will be found by simulation. In general, for a property concerning a single path (with the existential path quantifier), the generated vectors must be directed toward finding a witness. For a property concerning all paths (with the universal path quantifier), the generated vectors must be directed toward finding a counter-example. The term "Witness Graph" is used to denote the collection of states and transitions in the design which are useful for enumerating witnesses or counter-examples for the required property. The process of generating a Witness Graph is described in detail in the section entitled, "Witness Graph Generation".

Guidance is provided during vector generation by means of constraints embedded in the testbench itself. The constraints are derived through a combination of user hints, feedback from previous simulation runs, and, most importantly, from the Witness Graph. Generation of actual input vectors is accomplished at simulation time by generating random patterns and using these constraints as a filter to select the desirable ones. This is described in detail in the section entitled, "Guidance for Witness Generation." The paradigm of using embedded constraints within the testbench as filters during simulation is similar to existing techniques <25, 27>. An important difference is that in this case, the constraints are generated automatically through a more detailed analysis of the design than may be possible manually. The implementation details for a complete flow of this testbench generation framework are provided in the section entitled, "The Complete Testbench Generation Flow," along with some practical results.

This work is broadly related to other works which have used formal verification techniques along with simulation for functional validation. In particular, an abstract model is abstracted from the design description for generating simulation vectors <10, 11, 13>. However, this model is further modified depending on the correctness property of interest, and focus on automatic generation of the testbench, not just the simulation vectors. Similarly, symbolic methods have been employed within simulation to make it more effective <9, 30>. However, this has so far been targeted at obtaining better coverage for reachability and invariant checking, rather than handling more general correctness properties. The details of some of these methods also bear resemblance to known techniques—these are described in more detail through rest of the disclosure.

Witness Graph Generation

The intended purpose of a Witness Graph is to serve as a property-specific abstract model of the design, which captures witnesses/counter-examples of the property. For practical reasons, the focus is on generation of a small Witness Graph that is also complete, i.e. it should include all witnesses/counter-examples.

An iterative refinement approach is followed for generation of a Witness Graph, where the start is from a very abstract model of the design, followed with performing deterministic analysis for pruning it, and then refining it to perform analysis again. The iterative process is repeated until resource limitations are reached. This flow is shown within the dashed box in FIG. 4—each of its components is described in detail in this section. As also shown in this figure, the Witness Graph is subsequently annotated with priorities etc., which is then used for automatic generation of the testbench.

Design Representation

This framework assumes the availability of a design representation at a level from which an FSM (finite state machine) model of the design can be extracted and traversed. An RTL representation allows reasoning about relationships between variables involved in logical and arithmetic expressions, potentially making the testbench constraints tighter. In addition, a distinction between control state and data state allows an easier and more effective abstraction of the design state space. To illustrate the potential of this approach, the design considered is an RTL description, with a clear distinction between data and control state, in the style of a CDFG (control data flow graph), as shown in FIG. 5.

A typical fragment of such a CDFG description is shown below, where each label in the code corresponds to a control state with datapath and branching actions in it:

```
in ter(0:2) i, j;
in ter(0:3) A, B, C, F;
out ter(0:1) T;
process main( )
{
    reg(0:3) D, K, H, M;
    L0:
        goto L1;
    L1:
        H=0; M=0; D=0;
        if (A > 2)
            D=1;
        switch(i) {
            case 0: goto L2; break;
            case 1: goto L3; break;
            default: goto L6;
        }
    L2:
        . . .
}
```

Property Representation

A brief overview of CTL and model checking is provided here for quick reference; details can be found in <6>. Predicates in CTL enable reasoning about the behavior of a given design over time, with respect to a set of atomic propositions that characterize each state. Given a set of atomic propositions A, the set of CTL formulas is recursively defined as follows:

$CTL$ formulas $= p \in A \mid \,! f \mid f * g \mid f +$
$g \mid EX\ f \mid EF\ f \mid EG\ f \mid E\ (f\ Ug) \mid AX\ f \mid AF\ f \mid AG\ f \mid A\ (f\ Ug),$ where p denotes an atomic proposition, f and g are CTL formulas, and !/*/+ denote the standard Boolean negation/conjunction/disjunction operators, respectively. The semantics of CTL is defined with respect to a Kripke structure K=(S, R, L), consisting of a set of states S, a total binary relation R on S, and a labeling L of the states in S by atomic propositions in A. The truth of a CTL formula is interpreted with respect to a state, by considering the tree of infinite computations starting from that state. The CTL modalities consist of a path quantifier A (all paths) or E (exists a path), followed by a temporal operator—X (next time), F (eventually), G (globally), U (until). For example, a formula AG f is true in a state s, if on all paths starting from s, formula f is true globally in each state along the path. Similarly EF f is true in a state s, if there exists some path starting from s, such that formula f is eventually true on some state on that path. The nesting of these modalities can express many correctness properties such as safety, liveness, precedence etc. The fragment of CTL using only the A (E) quantifiers, with negations only at the atomic level, is also referred to as ACTL (ECTL). Typically, model checking is used to check the truth of a formula with respect to the initial state of a given finite state design. By encoding the transition relation of the design as a Boolean relation, and using Boolean formulas to characterize finite sets of states, symbolic model checking can be performed by exploiting fixpoint characterizations of the temporal operators <4, 22>. These techniques are largely based on BDD representations and symbolic manipulation algorithms for Boolean functions which are efficient in practice <3>.

Initial Abstract Model

Given a design in CDFG form, and a correctness property in CTL, obtaining an initial abstract model of the design is needed. First, the cone-of-influence abstraction <2, 18> is used, whereby any part of the design that does not affect the property is removed. In this case, since the number of control states in a CDFG design representation is typically small, a static analysis can be performed to identify irrelevant datapath operations. This typically provides better abstraction than a purely syntactic analysis on the next state logic of a standard RTL description. Next the focus is on the controller-datapath separation. Datapath variables that do not directly appear as atomic propositions in the CTL property are candidates for abstraction as pseudo-primary inputs, thereby resulting in a much smaller state space than that of the concrete design. The resulting model constitutes an upper bound approximation of the underlying Kripke structure <18, 19, 20, 21>. At this stage, the user can also manually give hints about which parts of the design to include in the abstract model, and to carry out appropriate bit-width abstraction.

As a running example for this section, consider the CDFG design description shown in FIG. 6. It consists of 9 control states, labeled ST0–ST8, with initial state ST0. The variables i, j, A, B, C, and F are primary inputs, and all other variables make up the datapath state. The light bordered boxes indicate the datapath operations executed in each control state, while the labels on the edges between control states identify the conditions under which those transitions take place. Note that while the number of control states is small, the total state space is actually large if the full datapath state is modeled. Suppose the property to be checked is EF (M>=6), i.e. it is desired to check the existence of a path starting from ST0 on which eventually some state satisfies M>= 6.

Cone-of-influence analysis is used to determine that state ST3 does not contain any relevant datapath operations. Next, since M is the only datapath variable referred to in the atomic proposition, M and its immediate dependency H are included as state variables. All other data variables are regarded as pseudo-primary inputs. This also allows the datapath operations in states ST1, ST2, ST4 to be considerably simplified. The resulting abstract model is shown in FIG. 7, where the abstracted variables have been shaded out.

Analysis of the Abstract Model

The next step in this flow is to perform deterministic analysis on the abstract model in order to identify states/transitions/paths that contribute to a witness or a counter-example for the property of interest. This can be done by a variety of methods including symbolic model checking <4, 22>, constraint solving <5, 8, 14> etc.

In this section, a symbolic model checking-based algorithm for CTL properties is described, which is used to compute states of interest in the abstract model. The pseudo-code for this algorithm, called mc_for_sim (model checking for simulation), is shown in FIG. 8. Its inputs are an abstract model m, which has a smaller number of state variables but potentially more transitions than the concrete design d, and a CTL formula f in negation normal form, where all negations appear only at the atomic level. As before, if the original property is an A-type formula, all counter-examples are looked for. On the other hand, if the original property is an E-type formula, all witnesses are looked for. For the rest of this discussion, the assumption is that the goal lies in finding witnesses—the same discussion holds, however, for finding counter-examples.

The main idea is to use model checking over m to precompute a set of abstract states which are likely to be part of witnesses, and to use this set for guidance during simulation over d, in order to demonstrate a concrete witness. In particular, over-approximate sets of satisfying states are targeted during model checking, so that searching through an over-approximate set of witnesses during simulation can be performed. Note that model checking is performed over the abstract model m, while simulation is performed over the concrete design d.

Since atomic level negations can be computed exactly, and all other CTL operators in a negation normal form are monotonic, an over-approximation for the overall formula can be computed by computing over-approximations for the individual subformulas. As shown in FIG. 8, the mc_for_sim algorithm works in the standard bottom-up manner over the CTL subformulas, which are represented in the form of a parse tree (where leftChild(f)/rightChild(f) denote the left and right subformulas of f, respectively). With each subformula, the algorithm associates a set of abstract states called upper, which corresponds to an over-approximate set of concrete states that satisfy the subformula. The standard symbolic model checking method is adequate for handling atomic propositions (which are computed exactly) and Boolean operators (which simply propagate over-approximations in the sets associated with the subformulas). For subformulas beginning with an E-type operator (EX, EF, EU, EG), standard model checking over m (function mc_etype) itself ensures that the result is an over-approximation over d, since m has more paths than d<19, 21>. For subformulas beginning with an A-type operator (AX, AF, AU, AG), the situation is more complicated. Since m may have many false paths with respect to d, standard model checking over m may result in an under-approximation over d. Therefore, upper is computed by considering the corresponding E-type operator, which is guaranteed to result in an over-approximation. However, this over-approximation is rather coarse. To mitigate this effect, a set of abstract states called negative is also computed, which corresponds to the intersection of set upper with a set which is recursively computed for the negation of the A-type subformula. Note that, by induction, the latter set corresponds to an over-approximate set of concrete states that satisfy the negated subformula. The use of these sets is described later. To summarize, the mc_for_sim algorithm associates sets of abstract states (upper/negative) with each subformula.

Though not shown in the pseudo-code in FIG. 8, an actual implementation of the above algorithm keeps track of the visited nodes in the parse trees of the various CTL subformulas, such that each node is explored at most once. As a result, at most two recursive calls are made for each subformula of the CTL property—one for the subformula itself, and the other for its negation. Thus, its overall complexity is the same as that of standard symbolic model checking.

Conclusive Proof Due to Model Checking

It is possible that model checking on m itself provides a conclusive result for d in some cases. Pseudo-code for performing this check is shown in FIG. 9. First, the mc_for_sim algorithm is used to compute the sets upper/negative for all subformulas (and the required negations) of the property. Recall that the set upper corresponds to an over-approximate set of concrete satisfying states. Therefore, if the initial state does not belong to this set, clearly the property is false. Now, assume that the initial state does belong to set upper. Recall also that for an A-type operator, we compute the set negative. If the initial state does not belong to set negative, then there does not exist any path in m starting from the initial state that shows negation of the property. Therefore, it is guaranteed that no such concrete path exists in d, i.e. the property is true. In all other cases, the result from model checking is inconclusive.

Partial Proof Due to Model Checking

When the result due to model checking alone is inconclusive, simulation for generating witnesses/counter-examples for the property is resorted to. For full CTL, the alternation between E and A quantifiers needs to be handled. In general, handling of "all" paths is natural for model checking, but is unsuitable for simulation. The purpose of precomputing negative sets for A-type subformulas is to avoid a proof by simulation where possible. Note that an abstract state s which belongs to upper, but not to negative, is a very desirable state to target as a witness for the A-type subformula. Again, this is because there does not exist any abstract path in m starting from s for the negation of the subformula, thereby guaranteeing that there is no such concrete path in d. Therefore, the proof of the A-type subformula is complete as soon as state s is reached during simulation, with no further obligation. On the other hand, if a state t belongs to negative also, the task during simulation is to check whether there is a concrete path starting from t which shows the counter-example for the A-type subformula. If such a counter-example is found, state t is not a true witness state for the A-type subformula, and can be eliminated from further consideration. This fact is used in the witness generation algorithm described in detail in the section entitled, "Guidance for Witness Generation."

Related Work

This abstraction technique and mc_for_sim algorithm are similar to other works in the area of abstraction and approximate model checking <19, 20, 21, 23>. Like many of these efforts, an "existential" abstraction which preserves the atomic propositions in the property to obtain model m is used. This allows the use of standard symbolic model checking techniques to compute sets upper (over-approximations) for most subformulas. Furthermore, this computation of the negative sets for the A-type subformulas is similar to computing under-approximations, in the sense that the complement of an over-approximation for the negated subformula can be seen as an under-approximation for the subformula itself. However, the purpose for computing these approximations is not only to use these sets for conservative verification with conclusive results due to model checking, or for iterative refinement (described later in the section entitled, "Iterative Refinement of the Abstract Model"). Ultimately, these sets are used to provide guidance during simulation for designs where it may not be possible to perform any symbolic analysis at all. Therefore, unlike existing techniques, this mc_for_sim algorithm specifically avoids employing existential/universal quantification over the state space of concrete variables. Instead, coarser approximations are used—using the E-type operators in place of the A-type operators. Indeed, it would be appropriate to use any known technique for obtaining the tightest possible approximations. The additional contribution is also in showing how these sets can be used to demonstrate concrete witnesses in the context of simulation.

Pruning of the Abstract Model

The main purpose of performing deterministic analysis on the abstract model is to prune it by removing states/transitions/paths which do not contribute to a witness/counter-example during simulation. Note that the interest is in marking states that not only start a witness/counter-example, but demonstrate it fully. The crucial observation is that for any CTL formula f, except of type EX/AX, such states also satisfy f. For atomic propositions and Boolean operators, this is trivially true since there are no paths to consider. For type EF/EU/EG, the witnesses are paths where each state satisfies f. Similarly, for type AF/AU/AG, counter-examples are paths where each state satisfies !f. Indeed, it is only for EX/AX, that additional states are needed, i.e. those that satisfy the subformula of f. Therefore, state marking can be done using the set of satisfying states once at the top, followed by additional marking only in the EX/AX case.

In the context of the mc_for_sim algorithm, satisfying sets for subformulas (and their negations) are over-approximated as sets upper (and negative). FIGS. 10a and 10b show the pseudo-code for this algorithm for marking witness states, in terms of a top level function mark_witness_top, and a recursive function mark_witness_rec, where the function mark_states does the actual marking of a given set of states. Any states that remain unmarked at the end are pruned away by replacing them with a single state called "sink". (In order to allow repeated use of model checking on the pruned model, every transition out of "sink" leads back to itself, and all atomic propositions in the CTL property are assumed to be false in the "sink" state.)

The function mark_witness_rec also associates sets witness/neg_witness with each subformula, based on the sets upper/negative computed earlier. Since the latter sets are computed bottom-up, the former sets top-down are used as care-sets for constraining solutions. At the topmost level, the set of reachable states is used as the care-set. Note that the special handling of EX-type subformulas requires an extra image computation in order to exploit the care-set. In general, such use of care-sets may result in substantial pruning. Another kind of pruning occurs due to the A-type subformulas. Recall that for a state s that belongs to set upper, but not to set negative, the proof of the A-type subformula holds due to model checking itself. Therefore, there is no need to extend a witness from this state during simulation. Instead, it is necessary to focus on states that belong to set negative, in order to search for a concrete counter-example during simulation. Therefore, recursive calls are made to mark witnesses for the negated subformula, which are then associated as the set neg_witness.

Returning to the example, for the abstract model of FIG. 7, the states ST3 and ST6 remain unmarked after performing the above analysis. This is because there is no path through these states that can demonstrate a witness for the property EF (M>=6). Therefore, these states are abstracted as the "sink" state, as shown in FIG. 11.

Iterative Refinement of the Abstract Model

The amount of detail that can be allowed in the abstract model is a function of the level of complexity that the model checker or constraint solver can handle in its analysis. However, once pruning is done, the model can be refined, and it may be possible to perform the analysis again. Recall that the initial abstract model was obtained by abstracting away many of the datapath variables as pseudo-primary inputs. Refinement is performed by selectively bringing back some of these datapath variables into the state space of the abstract model. Note that pruning after analysis reduces the size of the model, while refinement increases it. This iterative increase/decrease in the model size is shown in FIG. 12.

Getting back to the example, suppose it is decided to add datapath variables D and K as state. This results in the model shown in FIG. 13. After performing model checking on this refined model, the states marked "ST2,D==0" and "ST4, K<=5" can be pruned further, since no path through these states can provide a witness to the property.

At this point, it may not be desired to add any more datapath state to the model, leading to the final Witness Graph as shown in FIG. 14. This is the collection of paths from which one (not going through state "sink") must be sensitized during simulation of the entire design.

Again, these techniques for iterative refinement are similar to those used by other researchers, where either a single counter-example on the abstract model <1, 7, 18>, or lack of a conclusive result from the abstract model <20, 23> is used to guide further refinement. In contrast, the focus herein is on all counter-examples/witnesses during model checking. Furthermore, the associated sets are herein used for marking states in order to prune the abstract model before attempting further refinement. Existing techniques do not perform such model pruning. Finally, since the target herein includes bigger designs than can be handled by any kind of symbolic traversal, the goal of this iterative refinement process is not only to obtain a conclusive result by model checking. Rather, it is to reduce the gap between the abstraction levels of the final Witness Graph and the concrete design to be simulated.

Witness Graph as a Coverage Metric

Apart from using a Witness Graph for generating a testbench, it can also be used as a coverage metric for evaluating the effectiveness of a given set of simulation vectors. Essentially, the Witness Graph captures states/transitions/paths which are of interest in checking a given property. The better the coverage of a given set of simulation vectors over this graph, the more likely it is that simulation will succeed in proving/disproving the property. Note that a high coverage still does not guarantee correctness in the design—it only provides a metric to assess the quality of simulation.

Most available metrics are based either on code coverage of the HDL design description—line/branch/toggle coverage, e.g. <26>, or on extraction of FSM models from the given design description and using state/transition coverage as metrics <11, 13>. In contrast, this metric is obtained by analysis of the design with respect to the given property. Recently, there has also been work on specification coverage metrics, which focus on how much of the design space is covered by multiple properties <12, 16>. These techniques can potentially be used to extend this per-property analysis to coverage of overall correctness.

Guidance for Witness Generation

In this section there is described the process of generating the testbench which uses the Witness Graph for guidance in order to target witnesses/counter-examples during simulation of the concrete design.

Backtracking Search Algorithm

In the context of the algorithms for analysis of a given design and CTL property, described in the section entitled, "Witness Graph Generation", above, a start is made by describing an algorithm called witness_sim, which can be used to generate a concrete witness during simulation. The testbench is patterned upon this algorithm, and can be automatically generated for a given property.

The pseudo-code for witness_sim algorithm, as shown in FIGS. 15a, 15b, and 15c, is based on the structure of the CTL formula, and uses the sets witness/neg_witness associated with each subformula computed earlier. It is organized as a backtracking search algorithm, which returns SUCCESS if it succeeds in finding a concrete witness for a given formula f, starting from a given state s, in a given design d; and FAILURE otherwise.

The handling of atomic propositions and Boolean operators is fairly obvious. The E-type temporal operators are also handled by using their standard characterizations in terms of image and fixpoint operations, where abs(s) refers to the abstract state corresponding to a concrete state s. The handling of the A-type operators reflects the above remarks that—if abs(s) does not belong to set negative, the proof of the A-type subformula is complete due to model checking itself, and the return can be SUCCESS. Otherwise, a counter-example for f is looked for starting from s. If such a counter-example is found, i.e. neg_result=SUCCESS, then the return can be FAILURE.

In principle, the witness_sim algorithm will find a concrete witness if it exists, because the witness sets computed earlier are based on over-approximations of concrete satisfying sets. However, in practice, it is impossible to search through all possible concrete states in the for each loops of the pseudo-code. Such search would be typically limited by available resources, such as space and time. Therefore, the next task is to prioritize the search, in order to provide increased reliability with increased resources.

Prioritizing Search for Witnesses

In practice, any prior information about the existence of transitions/paths between two given concrete states can be used to prioritize the search in the foreach loops of the witness_sim algorithm. The designer may help in assigning priorities by providing hints, i.e. specifying control states or transitions which he/she believes must be on a path leading to a witness or a counter-example. Since the goal of the testbench is to supplement normal functional simulation, data from previous simulation runs which identify "easy to reach" states can be incorporated into the prioritization process.

In particular, symbolic analysis is also used on the abstract model itself to assign priorities for the abstract states. For example, the fixpoint approximations in the symbolic computation for the EF-type subformula can be used very simply to tag each state with the shortest distance to target. Similarly, starting from the satisfying states for an EG-type subformula, a separate greatest fixpoint computation can be conducted which iteratively removes those states that don't have a predecessor in the set. The approximations here can be used to tag each state with the shortest distance to a target loop which demonstrates the EG witness. Other schemes <15, 17, 24, 29> based on combination of distance, transition probabilities, static analysis, hints etc. can also be used. Other heuristics for priority assignment can be used.

Practical Example for Witness Generation

As an example of witness generation in practice, consider the correctness property f=EFAG p, where p is some atomic proposition. This example illustrates the handling of alternation between E and A, which is essential to this technique. There are two sets of interesting paths in the Witness Graph. The first set of paths (call this set Y) lead to states which satisfy EG p, but do not satisfy EF !p, i.e. to states that belong to set upper, but not to set negative for the A-type subformula. The second set of paths (call this set Z) have two distinct segments. The first segment (call this set Z.1) leads to a state satisfying EG p, and the second segment (there is a set Z.2 for each segment in Z.1) consists of paths starting at these states that are witnesses to EF !p. In other words, set Z.1 are paths to states that belong to both upper and negative for the A-type subformula.

The simulator first tries to sensitize the set Y, i.e. tries to generate inputs to follow a path in set Y. If one of the paths in Y is sensitizable, then EFAG p is shown to be true. Otherwise, the simulator tries to sensitize a path in Z.1. If a path segment in Z.1 is sensitizable, the simulator tries to sensitize a segment in the corresponding Z.2. If this segment is sensitizable, the simulator must eliminate this Z.1 candidate, and try another. However, if no segment from Z.2 is sensitizable, then EFAG p is very likely true and the simulation may stop. On the other hand, when all paths in Z.1 are exhausted without establishing the truth of EFAG p, then the property is false with high probability.

The Complete Testbench Generation Flow

The overall architecture of a prototype implementation of this smart testbench generator is shown in FIG. 16. It consists of three main components—an abstract CDFG generator (upper left), a Witness Graph generator which begins with the abstract CDFG and generates a Witness Graph (upper right), and a final stage which processes the Witness Graph to create the testbench (lower part). Dotted boxes are inputs to the smart testbench generator provided by the designer or external programs. Solid boxes are intermediate representations of the design or Witness Graph. Dark ellipses are subprograms that perform operations on one representation and generate another. The light ellipse is an external subprogram (the model checker) used by the prototype.

Abstract CDFG Generator

The structural abstractor (bubble 1) takes as inputs a CTL property and a design description in the form of a CDFG. The CDFG can be produced from parsing an HDL description of the design in VHDL, Verilog, or C; which also segments the design into a control and data part. For a practical embodiment, the CDFG may be generated by the high level synthesis system called Cyber <28>. The structural abstractor performs a cone-of-influence analysis on the design with respect to the property.

Witness Graph Generator

The abstract CDFG is the input to the model iterator (bubble 2). For the first iteration, the model iterator chooses certain datapath variables to be abstracted as pseudo-primary inputs. These variables are chosen heuristically by performing a control- and data-dependency analysis with respect to the property. Techniques such as linear programming and ATPG techniques <8, 14> can also be used to prune paths from the abstract CDFG which cannot possibly be involved in finding a witness/counter-example to the CTL property. In general, the model iterator performs other tasks on the second and subsequent iterations. These will be discussed later in this section. The L1 (Level 1) model at the output of the model iterator is the abstract model on which model checking is performed.

The MC interface (bubble 3) transforms the L1 model into a form accepted by a model checker. For a practical embodiment, VIS <2>, a publicly-available tool for symbolic CTL model checking may be used. The interface supports most high-level arithmetic/logical operators in the design description by translating them into bit-level circuits (in blif-mv format), and also translates the CTL formulas appropriately. Other model checkers targeted at control-datapath separation may also be used.

After model checking, the error trace generator (bubble 4) identifies all error traces (counter-examples or witnesses) for the property. Indeed, the model checking code in VIS is itself modified to capture all traces in FSM form i.e. as an L2 (Level 2) model. In the event that the model checker has proved a conclusive result, or if the datapath has been fully expanded, the model checker will itself generate a witness/counter-example if possible. Therefore, no further analysis or simulation is needed, and the testbench generator terminates. On the other hand, if the model checking result is inconclusive, a decision can be made either to terminate analysis, whereby the current L2 model becomes the final Witness Graph, or to continue analysis by using the model iterator again.

The principal job of the model iterator is to refine the L2 model by adding datapath detail, and to perform further dependency analysis/constraint solving, resulting in a new L1 model. To refine the L2 model, some datapath variables that were abstracted away as pseudo-primary inputs are brought back as state variables. Dependency analysis is similar to that done in the structural abstractor, while constraint solving is similar to that described for the first iteration. Note that as a result of the pruning and refinement in each iteration, the final model (Witness Graph) has much more detail than would be possible otherwise.

Test Bench Generation

The Witness Graph now contains possible paths to show witnesses or counter-examples. Since these paths exist in the abstract model of the design, many of these paths may not actually be sensitizable in the full design, i.e. simulation on the full design may result in blocking of some of these paths. To achieve maximum benefit from random vector simulation, it is important to guide or direct the simulator to likely paths leading to targets. To aid in achieving this goal, all transitions in the Witness Graph are assigned priorities, representing the likelihood of that transition being a path segment of a witness/counter-example.

The priority generator (bubble 5) accepts designer hints, simulator trace data, and the Witness Graph, and annotates the transitions with priorities. The priority on a transition indicates the importance of taking that transition relative to the other transitions out of the present state. The priority is based on the ease with which that transition can be taken, the number of paths following that transition in the Witness Graph leading to a target state, the distance of the successor state from the final states etc.

The priorities are stored in a database accessible to the testbench during simulation. Conceptually, the database is a table with a row for each present-state next-state pair of the Witness Graph. Each row contains at least the priority for that transition, and the condition under which the transition can be achieved. The representation of the database is extensible, in that it can easily store additional information to help minimize the time for vector generation.

The testbench generator (bubble 6) produces the C code for the testbench. Constraint solving results are used to bias the ranges of vectors produced by the random vector generator.

The testbench (bubble 7) is responsible for guiding and directing the simulator. The job of the testbench is to generate vectors using information from the database until a path in the Witness Graph has been completely simulated. The testbench is aware of the level of abstraction in the Witness Graph. It is also aware of the complete current state of the design. The basic simulation setup is shown in FIG. 17. Apart from the inclusion of a database with the state transition priorities, there is no distinction between this simulation setup and the conventional one. This is important since it is one of the goals to minimize perturbation of the conventional simulation flow as much as possible.

Given the current state, the testbench queries the database for the abstract state it should attempt to visit next. Currently, the testbench generates random vectors, and filters them according to the transition condition. A constraint solver to directly generate such vectors where possible may be used. Then, the vector is applied, and a check is made to see if the desired abstract state has been reached. This is the slowest part of the process, since the entire design must be simulated for each generated vector. If the desired state has not been reached, the design must be reverted back to its previous state, and another vector tried.

For the sake of completeness, a simplified skeleton of a testbench is shown in FIG. 18.

It will further be appreciated that many variations on the above-described embodiments of the invention may be made without departing from the scope and spirit of the invention. Other description and modeling languages may be used, and certain steps may be performed in parallel or in a different order than presented.

It will moreover be appreciated that the many specificities described in the foregoing detailed description are included only for the sake of clearly describing the invention in the form of instructive embodiments, and that these specificities are not to be interpreted as limiting the scope of the invention. Rather, the scope of the invention should be determined in accordance with the appended claims.

What is claimed is:

1. A method of verification for a design, comprising:
providing a description of said design;
specifying correctness criteria for said design, wherein said correctness criteria are expressed as one or more correctness properties;
abstracting said design description to provide an abstract model of said design;
generating a witness graph for said one or more correctness properties based on a deterministic analysis of said abstract model where the deterministic analysis serves to modify the abstract model by iteratively refining and pruning states and transitions which capture all witnesses or counterexamples demonstrating said one or more correctness properties; and
when the deterministic analysis does not produce a conclusive result, generating a testbench automatically from said witness graph for performing simulation with said testbench, where the testbench generates simulation test vectors for the simulation that target states and transitions in the witness graph when searching for a concrete witness or counterexample with respect to said correctness criteria.

2. The method for verification as set forth in claim 1, wherein:
said generation of said testbench comprises:
determining embedded constraints for guiding vector generation based on said witness graph;
determining priorities for guiding said vector generation based on said witness graph;
generating a vector generator module including said embedded constraints and said priorities; and
generating a monitor module, said monitor module checking said conclusive result;
said simulation of said design, using said generated test bench, comprises:
generating said vectors with said vector generator module based on said embedded constraints, including generating random patterns and using said constraints as a filter to select desirable ones of said random patterns; and
checking said monitor module for property violation or satisfaction.

3. The method of verification as set forth in claim 2, wherein:
said embedded constraints are derived from transition conditions in said witness graph; and
said priorities are associated with transitions in said witness graph.

4. The method of verification as set forth in claim 3, wherein:
said priorities are generated from said witness graph based on one or more of:
distance to targets;
transition probabilities; and
simulation trace data.

5. The method of verification as set forth in claim 1, wherein:
said generation of said witness graph comprises:
removing a portion from said design when an influence determination does not indicate that said portion of said design is in a cone of influence of said property;
modeling, as an initial abstract model, a controller state and variables in a datapath state directly involved in predicates of said correctness property;

performing deterministic analysis on said abstract model; and pruning said abstract model to obtain said witness graph;

said influence determination indicates said portion of said design is in said cone of influence of said property when said portion of said design is one or more of:

a portion directly affecting said variables in said predicates of said property; and a portion affecting branching which in turn affects predicates of said property;

said deterministic analysis determines which portion in said abstract model indicates paths relating to said conclusive result for said property;

said pruning comprises removing a portion in said abstract model indicated by said analysis not to relate to said conclusive result for said property.

6. The method of verification as set forth in claim 5, wherein:

said pruning is followed by a step of refining said abstract model by adding variables from said datapath state to provide a refined abstract model;

said analysis, pruning, and refining steps are performed in an iterative process; and said witness graph is said refined abstract model at the end of said iterative process.

7. The method of verification as set forth in claim 5, wherein said property is represented using a computation tree logic (CTL) formula.

8. The method of verification as set forth in claim 7, wherein said step of analysis is performed by:

determining CTL subformulas of said CTL formula;

with each of said CTL subformulas, associating a given set of abstract states corresponding to an over-approximate set of concrete states satisfying said CTL subformula, said given set of abstract states defining an upper set;

for ones of said CTL subformulas beginning with an E-type operator, performing standard model checking over said abstract model;

for ones of said CTL subformulas beginning with an A-type operator:

selecting an E-type operator corresponding to said A-type operator and guaranteed to result in an over-approximation; and computing an other set of abstract states, corresponding to an intersection of said upper set with a set recursively computed for the negation of said A-type operator, said other set of abstract states defining a negative set;

checking an initial state of the design to determine a conclusive result, wherein:

when said initial state does not belong to said upper set, determining said property to be conclusively proved to be false;

when said property represented using said CTL formula starts with said A-type operator, and when said initial state belongs to said upper set, and when said initial state does not belong to said negative set, determining said property to conclusively proved to be true; and determining said analysis to be inconclusive when said property is not conclusively to be proved to be one of true and false.

9. The method of verification as set forth in claim 8, wherein said step of pruning comprises:

marking witness states; and then pruning unmarked states by replacement with a sink state having every transition therefrom leading to said sink state, and all atomic propositions in said sink state being assumed false.

10. The method of verification as set forth in claim 9, wherein said step of marking said witness states comprises:

computing a witness-top set of states consisting of the intersection of set of states reachable from initial state of said design and said upper set;

marking all of said witness-top set of states;

using a marking procedure, for each of said CTL subformulas of said CTL formula representing said property, with said witness-top set defining a care set, comprising the steps of:

associating with said CTL subformula, as a witness set thereof, a given set of states defined by the intersection of said upper set associated with said CTL subformula and said care set;

for ones of said CTL subformulas beginning with said EX operator:

marking additional states in the image of said witness set; and recursively applying said marking procedure to the CTL subformulas thereof, beginning with said EX operator, with said additional states as said care set;

for ones of said CTL subformulas beginning with an A-type operator:

determining a neg-witness set as the intersection of said negative set associated with said A-type subformula and said care set; and recursively applying said marking procedure on the negation of said A-type subformula, with said neg-witness set as said care set; and for all other types of said CTL subformulas, applying said marking procedure recursively on the CTL subformulas thereof, with said witness set as said care set.

11. The method of verification as set forth in claim 10, wherein said vector generator module is generated to include a search of said witness and neg-witness sets of states for a concrete witness, returning an indication of success when finding said concrete witness.

12. The method of verification as set forth in claim 11, wherein said search is conducted suing a backtracking method comprising:

specifying a CTL formula;

specifying a given concrete state belonging to said witness set associated with said CTL formula;

starting from said concrete state;

determining an indication of success when there exists a concrete witness for said CTL formula, and failure otherwise; and backtracking when said indication is failure, wherein:

when said CTL operator is not an A-type operator, search subproblems are conducted on the subformulas of said CTL subformula and each concrete state belonging to the associated witness sets;

when said CTL operator is an A-type operator and said state does not belong to said negative set, said indication is success;

when said CTL operator is an A-type operator and when said state belongs to said negative set, a search subproblem is set up with the negation of said CTL formula and said concrete state, wherein success of said negated subproblem indicates failure, and failure of said negated subproblem indicates success.

13. The method of verification as set forth in claim 12, wherein:
said search subproblems on said CTL subformulas and said concrete states belonging to the associated witness sets are set up in a prioritized manner based on one or more of:
distance to targets,
transition probabilities, and
simulator trace data.

14. The method for verification as set forth in claim 1, wherein said deterministic analysis comprises using symbolic model checking on the abstract model to identify states and transitions which capture all witnesses or counterexamples demonstrating the correctness properties.

15. The method for verification as set forth claim 14, wherein said model checking further comprises:
determining sub-properties for said one or more correctness properties;
for each sub-property that can be represented with an operator applying to all paths in the abstract model, computing a negative set which is an intersection of states and transitions in the abstract model which satisfy a negation of the sub-property and states and transitions in the abstract model which satisfy an over-approximation of the sub-property, such that the negative set can be used to identify states and transitions which capture witnesses or counterexamples for the sub-property.

16. The method for verification as set forth in claim 15, wherein said one or more correctness properties are represented using a Computation Tree Logic (CTL) formula and wherein the sub-properties are CTL subformulas.

17. The method for verification as set forth in claim 16, wherein the operator applying to all paths in the abstract model is an A-type operator.

18. The method for verification as set forth in claim 16, wherein the operator applying to some paths in the abstract model is an E-type operator.

19. The method for verification as set forth in claim 1, wherein said deterministic analysis comprises using constraint solving on the abstract model to identify states and transitions which capture all witnesses or counterexamples demonstrating said one or more correctness properties.

20. The method for verification as set forth in claim 1, wherein the step of generating the witness graph further comprises the steps of:
refining the modified abstract model for the deterministic analysis by selectively bringing back datapath variables into the abstract model; and
using the deterministic analysis to prune the modified abstract model by removing states which cannot serve as either a witness or counter-example for said one or more correctness properties.

21. The method for verification as set forth in claim 20, wherein the steps of refining and pruning are iterated until a limit on resources is reached.

22. The method for verification as set forth in claim 1, wherein the testbench prioritizes the simulation search for said concrete witnesses or counterexamples based on said witness graph.

23. A method of assessing simulation coverage of a given set of simulation vectors for a given design, comprising:
providing a description of said design;
specifying correctness criteria for said design, wherein said correctness criteria are expressed as one or more correctness properties;
generating a witness graph for one or more of said correctness properties; and
determining coverage of said witness graph, using said given set of simulation vectors, by marking entities visited by said given set of simulation vectors in said witness graph, said entities being selected from the set consisting of states, transitions, and paths;
wherein said generation of said witness graph comprises:
removing a portion from said design when an influence determination does not indicate that said portion of said design is in a cone of influence of said property;
modeling, as an initial abstract model, a controller state and variables in a datapath state directly involved in predicates of said correctness property;
performing deterministic analysis on said abstract model; and
pruning said abstract model to obtain said witness graph;
said influence determination indicates said portion of said design is in said cone of influence of said property when said portion of said design is one or more of:
a portion directly affecting said variables in said predicates of said property; and
a portion affecting branching which in turn affects predicates of said property;
said deterministic analysis determines which portion in said abstract model indicates paths relating to said conclusive result for said property; and
said pruning comprises removing a portion in said abstract model indicated by said analysis not to relate to said conclusive result for said property.

24. A device-readable medium comprising program instructions for causing the device to perform verification for a design, comprising:
receiving an abstract model of said design, said abstract model abstracted from a design description of said design;
receiving one or more correctness properties representing correctness criteria specified for said design;
generating a witness graph for said one or more correctness properties based on a deterministic analysis of said abstract model where the deterministic analysis serves to modify the abstract model by iteratively refining and pruning states and transitions which capture all witnesses or counterexamples demonstrating said one or more correctness properties; and
when the deterministic analysis does not produce a conclusive result, automatically generating a testbench from said witness graph for performing simulation with said testbench, where the testbench generates simulation test vectors for the simulation that target states and transitions in the witness graph when searching for a concrete witness or counterexample with respect to said correctness criteria.

25. The device-readable medium as set forth in claim 24, wherein said deterministic analysis comprises using symbolic model checking on the abstract model to identify states and transitions which capture all witnesses or counterexamples demonstrating the correctness properties.

26. The device-readable medium as set forth in claim 25, wherein said model checking further comprises:
   determining sub-properties for said one or more correctness properties;
   for each sub-property that can be represented with an operator applying to all paths in the abstract model, computing a negative set which is an intersection of states and transitions in the abstract model which satisfy a negation of the sub-property and states and transitions in the abstract model which satisfy an over-approximation of the sub-property, such that the negative set can be used to identify states and transitions which capture witnesses or counterexamples for the sub-property.

27. The device-readable medium as set forth in claim 26, wherein said one or more correctness properties are represented using a Computation Tree Logic (CTL) formula and wherein the sub-properties are CTL subformulas.

28. The device-readable medium as set forth in claim 27, wherein the operator applying to all paths in the abstract model is an A-type operator.

29. The device-readable medium as set forth in claim 27, wherein the operator applying to some paths in the abstract model is an E-type operator.

30. The device-readable medium as set forth in claim 24, wherein said deterministic analysis comprises using constraint solving on the abstract model to identify states and transitions which capture all witnesses or counterexamples demonstrating said one or more correctness properties.

31. The device-readable medium as set forth in claim 24, wherein the step of generating the witness graph further comprises the steps of:
   refining the modified abstract model for the deterministic analysis by selectively bringing back datapath variables into the abstract model; and
   using the deterministic analysis to prune the modified abstract model by removing states which cannot serve as either a witness or counter-example for the correctness properties.

32. The device-readable medium as set forth in claim 31, wherein the steps of refining and pruning are iterated until a limit on resources is reached.

33. The device-readable medium as set forth in claim 24, wherein the testbench prioritizes the simulation search for said concrete witnesses or counterexamples based on said witness graph.

34. An apparatus for verification of a design comprising:
   an input module for receiving an abstract model of said design, said abstract model abstracted from a design description of said design, and for receiving one or more correctness properties representing correctness criteria specified for said design;
   a witness graph module for generating a witness graph for said one or more correctness properties based on a deterministic analysis of said abstract model when the deterministic analysis serves to modify the abstract model by iteratively refining and pruning states and transitions which capture all witnesses or counterexamples demonstrating the correctness properties; and
   a testbench module for generating a testbench automatically from said witness graph for performing simulation with said testbench, where the testbench generates simulation test vectors for the simulation that target states and transitions in the witness graph when searching for a concrete witness or counterexample with respect to said correctness criteria.

35. The apparatus as set forth in claim 34, wherein said deterministic analysis comprises using symbolic model checking on the abstract model to identify states and transitions which capture all witnesses or counterexamples demonstrating the correctness properties.

36. The apparatus as set forth in claim 35, wherein said model checking further comprises:
   determining sub-properties for said correctness properties;
   for each sub-property that can be represented with an operator applying to all paths in the abstract model, computing a negative set which is an intersection of states and transitions in the abstract model which satisfy a negation of the sub-property and states and transitions in the abstract model which satisfy an over-approximation of the sub-property, such that the negative set can be used to identify states and transitions which capture witnesses or counterexamples for the sub-property.

37. The apparatus as set forth in claim 26, wherein said correctness properties are represented using a Computation Tree Logic (CTL) formula and wherein the sub-properties are CTL subformulas.

38. The apparatus as set forth in claim 37, wherein the operator applying to all paths in the abstract model is an A-type operator.

39. The apparatus as set forth in claim 37, wherein the operator applying to some paths in the abstract model is an E-type operator.

40. The apparatus as set forth in claim 34, wherein said deterministic analysis comprises using constraint solving on the abstract model to identify states and transitions which capture all witnesses or counterexamples demonstrating the correctness properties.

41. The apparatus as set forth in claim 34, wherein said generating the witness graph further comprises:
   refining the modified abstract model for the deterministic analysis by selectively bringing back datapath variables into the abstract model; and
   using the deterministic analysis to prune the modified abstract model by removing states which cannot serve as either a witness or counter-example for the correctness properties.

42. The apparatus as set forth in claim 41, wherein the steps of refining and pruning are iterated until a limit on resources is reached.

43. The apparatus as set forth in claim 34, wherein the testbench prioritizes the simulation search for said concrete witnesses or counterexamples based on said witness graph.

* * * * *